(12) United States Patent
Takagiwa

(10) Patent No.: US 8,917,065 B2
(45) Date of Patent: Dec. 23, 2014

(54) PHOTOCOUPLER OUTPUT SIGNAL RECEIVING CIRCUIT

(71) Applicant: Fuji Electric Co., Ltd., Kawasaki-shi (JP)

(72) Inventor: Kazumi Takagiwa, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/738,445

(22) Filed: Jan. 10, 2013

(65) Prior Publication Data

US 2013/0127438 A1  May 23, 2013

Related U.S. Application Data

(63) Continuation of application No. PCT/JP2012/053367, filed on Feb. 14, 2012.

(30) Foreign Application Priority Data

Oct. 11, 2011  (JP) ................................. 2011-223598

(51) Int. Cl.
G05F 1/00       (2006.01)
G05F 3/08       (2006.01)
H03K 17/79      (2006.01)

(52) U.S. Cl.
CPC ...... *G05F 3/08* (2013.01); *H03K 17/79* (2013.01); *Y10S 323/902* (2013.01)
USPC ........................................ 323/221; 323/902

(58) Field of Classification Search
CPC ....... G05F 3/30; G05F 3/262; H02M 3/33523
USPC .................. 323/312, 315, 316, 317, 902, 221; 318/400.04, 577, 640
See application file for complete search history.

(56) References Cited

U.S. PATENT DOCUMENTS

| | | | |
|---|---|---|---|
| 4,970,620 A * | 11/1990 | Lehnhoff et al. | 361/18 |
| 5,121,283 A * | 6/1992 | Ibori et al. | 361/93.1 |
| 6,262,902 B1 | 7/2001 | Watanabe et al. | |
| 6,621,668 B1 * | 9/2003 | Sare | 361/13 |

(Continued)

FOREIGN PATENT DOCUMENTS

| | | |
|---|---|---|
| JP | 08-162929 A | 6/1996 |
| JP | 2000-174202 A | 6/2000 |

(Continued)

*Primary Examiner* — Gary L Laxton
*Assistant Examiner* — Alex Torres-Rivera
(74) *Attorney, Agent, or Firm* — Rossi, Kimms & McDowell LLP

(57) ABSTRACT

In aspects of the invention, a photocoupler output signal receiving circuit includes a first constant current circuit, connected between an input terminal and the high potential side of a direct current power source, that discharges current, a second constant current circuit, connected between the input terminal and the low potential side of the direct current power source, that takes in current, and switching elements that operate the first and second constant current circuits in a complementary way, wherein the switching elements are operated so that current is taken in by the second constant current circuit after a photocoupler is turned on, and are operated so that current is discharged by the first constant current circuit after the photocoupler is turned off, and a discharge current value in a current discharge period is reduced after a certain period elapses from the start of discharging.

2 Claims, 11 Drawing Sheets

(56) References Cited

U.S. PATENT DOCUMENTS

| | | | |
|---|---|---|---|
| 7,952,288 B2 * | 5/2011 | Nakazato | 315/3.5 |
| 8,362,712 B1 * | 1/2013 | Lebens et al. | 315/291 |
| 8,373,405 B2 * | 2/2013 | Fujita | 323/317 |
| 2005/0041444 A1 * | 2/2005 | Inoue | 323/316 |

FOREIGN PATENT DOCUMENTS

| | | |
|---|---|---|
| JP | 2007-150003 A | 6/2007 |
| JP | 2008-079374 A | 4/2008 |
| JP | 2008-172513 A | 7/2008 |

* cited by examiner

PHOTOCOUPLER OUTPUT SIGNAL RECEIVING CIRCUIT

CROSS-REFERENCE TO RELATED APPLICATIONS

This application is a continuation of International Application No. PCT/JP2012/53367, filed on Feb. 14. 2012, which is based on and claims priority to Japanese Patent Application No. JP 2011-223598, filed on Oct. 11, 2011. The disclosure of the Japanese priority application and the PCT application in their entirety, including the drawings, claims, and the specification thereof, are incorporated herein by reference.

BACKGROUND

1. Technical Field

Embodiments of the invention relate to photocoupler output signal receiving circuits used for isolating and transmitting signals in an intelligent power module (hereafter abbreviated to IPM).

2. Related Art

PWM (Pulse Width Modulation) inverters are widely used as power conversion devices that drive a three phase alternating current motor. Also, PWM converters are widely used as power conversion devices that obtain direct current voltage from a three phase alternating current power source. These power conversion devices are configured of a power circuit that carries out a direct current to alternating current or alternating current to direct current power conversion, a pre-driver that controls and drives the power circuit, a protective circuit, and a control circuit that centrally controls the circuits.

The power circuit is a circuit that supplies a drive current to the three phase alternating current motor and generates a main direct current power source, and is configured of a switching element such as an IGBT (insulated gate bipolar transistor), and a free wheel diode for causing energy when the switching element is turned off to flow as current. Also, the pre-driver is a circuit for driving the switching element. Furthermore, the protective circuit is a circuit that has various kinds of protective function, such as overcurrent protection, short circuit protection, overheat protection, and current and voltage drop protection.

The control circuit is configured of a controller and a central processing unit (CPU/ROM) including a memory such as a ROM (read only memory), carries out processes such as generating a PWM signal and issuing an alarm when detecting a problem, and centrally controls the PWM inverter or PWM converter.

Recently, a semiconductor device called an IPM in which, of the configurations, the power circuit, drive circuit, and protective circuit are incorporated as one package, has become commercially available, and is being widely used.

Herein, FIG. 7 is a block diagram showing a circuit configuration of an inverter device into which an IPM is incorporated.

The inverter device is connected to a two phase or three phase alternating current power source, and includes a converter 1 that converts alternating current into direct current, an electrolytic capacitor 2 for smoothing, an IPM 3, a buffer 4, a controller 5, a central processing unit (CPU/ROM) 6 including a memory, a switching transistor 7, a power source circuit formed of transformers 8 and 9 and a switching regulator 10, and a current transformer CT connected between the output side of the IPM 3 and a three phase alternating current motor M.

The controller 5 and central processing unit (CPU/ROM) 6 will be collectively called a control circuit 24.

The IPM 3 is integrally configured of a three phase inverter 11, configured of a semiconductor switching element such as an IGBT and a free wheel diode, whose alternating current output side is connected to the motor M, a pre-driver 12 that controls and drives the inverter 11, a protective circuit 13, an overcurrent detection sensor 14 and overheat detection sensor 15 connected to the protective circuit 13, a brake power element 16 and resistor 17 used when controlling the motor M so as to decelerate, and a pre-driver 18 that controls and drives the brake power element 16. Herein, a depiction of a signal line that sends a drive signal from the pre-driver 12 to the inverter 11 is omitted.

A control signal to the IPM 3 is sent from the control circuit 24 via the buffer 4 and photocouplers 21 and 23 to the pre-drivers 12 and 18 respectively, while an alarm signal when an overcurrent condition or overheat condition is detected by the sensor 14 or 15 is sent from the protective circuit 13 via the photocoupler 22 to the buffer 4.

Also, an output signal of the current transformer CT is input into the controller 5. As the current transformer CT carries out various kinds of control by detecting the output current of the IPM 3 and feeding back to the controller 5, it includes three through holes, and is installed inside the inverter device in a condition wherein wires or bars, which are the three phases of output current line of the inverter 11, are inserted into the through holes.

The inverter device with the heretofore described configuration is such that a direct current voltage converted by the converter 1 is converted into a three phase alternating current voltage by the inverter 11, and supplied to the motor M. The inverter 11 has a bridge circuit formed of a switching element and a free wheel diode, wherein the switching element converts a current eventually caused to flow through the motor M into an alternating current by carrying out a chopping control on the direct current voltage, and controls the motor M at variable speeds by changing the frequency of the alternating current.

Also, the controller 5 controls so that no distortion occurs in an inverter 11 output current waveform detected by the current transformer CT, and controls so that the output current does not reach or exceed a predetermined value.

The pre-drivers 12 and 18, which receive a control signal from the control circuit 24 after it is isolated by the photocouplers 21 and 23, include a current discharge function and a current intake function with respect to the photocouplers.

FIG. 8 is a block diagram of an input circuit of, for example, the pre-driver 12, with the input circuit of the pre-driver 18 also being configured in the same way as in FIG. 8. In FIG. 8, 25 indicates a direct current power source (a power source voltage $V_{cc}$ is, for example, 15V), 121 inside the pre-driver 12 is a constant current circuit (discharge side), 122 is a constant current circuit (intake side), 123 is a power source terminal to which the power source voltage $V_{cc}$ is applied, 124 is an input terminal to which an output signal $V_{in}$ of the photocoupler 21 is applied, 125 is a ground terminal, $R_{pu}$ is a pull-up resistor, ZD is a Zener diode, and $SW_1$ and $SW_2$ are switches (semiconductor switching elements) that operate in a mutually complementary way. 21a inside the photocoupler 21 is a light emitting diode acting as a light emitting unit, and 21b is a phototransistor acting as a light receiving unit.

The output signal $V_{in}$ will hereafter be called an "input signal $V_{in}$" when seen from the pre-driver 12 side.

Herein, the current discharge function and current intake function of the pre-driver 12 have an object of improving noise resistance.

That is, as shown in FIG. 9, while the voltage level of the input signal $V_{in}$ in FIG. 8 exceeds a threshold value $V_{inL}$ (before a time $t_1$), a current $I_{inH}$ flows as a discharge current from the input terminal 124 to the exterior via the constant current circuit 121 and switch $SW_1$ of FIG. 8, and the photocoupler 21 will not reach the threshold value $V_{inL}$ unless it draws in more current.

Meanwhile, when the voltage level of the input signal $V_{in}$ drops below the threshold value $V_{inL}$ at the time $t_1$, the pre-driver 12 stops the discharge of the current $I_{inH}$. Then, until the voltage level of the input signal $V_{in}$ exceeds a threshold value $V_{inH}$ at a time $t_2$, a current $I_{inL}$ flows as an intake current from the input terminal 124 to the interior (times $t_1$ to $t_2$) via the constant current circuit 122 and switch $SW_2$ of FIG. 8, and the photocoupler 21 will not reach the threshold value $V_{inH}$ unless it draws in more current.

That is, the pre-driver 12 carries out a discharge or intake of current in accordance with the voltage level of the input signal $V_{in}$ in order to improve the noise resistance of the photocoupler 21, with a maximum of the discharge current $I_{inH}$ of FIG. 9 flowing through the collector of the phototransistor 21$b$.

An isolating type signal transmission circuit, wherein a drive signal to an IPM switching element is isolated and transmitted by a photocoupler, is described in Japanese Patent Publication No. JP-A-2007-150003 (also referred to herein as "Patent Document 1"). The signal transmission circuit is such that, in order to prevent a drop in current conversion efficiency due to temporal depreciation of the photocoupler when routinely increasing the intake current, or the like, a transient current with an amplitude larger than normal is caused to flow through the light emitting diode when a switching element connected in series to the light emitting diode of the photocoupler is off, and in the same way, when a transistor inside a constant current circuit connected in series to the light emitting diode is maintained in a saturated condition, and the switching element is turned on.

Also, there is disclosed in Japanese Patent Publication No. JP-A-2008-172513 (also referred to herein as "Patent Document 2") an invention that, with an object of increasing photocoupler lifespan, includes a current compensation circuit that detects a temporal depreciation signal having a correlation with characteristic depreciation of a photocoupler light emitting diode, and increases the on-state current of the light emitting diode in accordance with the condition thereof.

As is also described in Patent Documents 1 and 2, the photocoupler characteristics depreciate with the passing of time, and when the internal light emitting diode is used for a long time, the light emitting efficiency decreases, and a current conversion efficiency CTR ($=I_c/I_f$) drops. Herein, $I_f$ is the input current flowing through the light emitting diode, and $I_c$ is the output current (collector current) of the phototransistor on the output side.

When actually using the photocoupler, the estimated lifespan of the photocoupler is calculated from the current conversion efficiency CTR, the load design values, and the like, and $I_f$ is determined. In order to increase the lifespan of the photocoupler, it is necessary to suppress the size of $I_f$. However, when $I_f$ is too small, noise resistance drops, and operating speed drops.

FIG. 10 shows $V_{ce}$ (the voltage between the collector and emitter of the phototransistor)—$I_c$ (the phototransistor collector current) characteristics, with the current $I_f$ flowing through the photocoupler light emitting diode as a parameter.

As previously described, in order to increase the phototransistor collector current $I_c$ to improve the pre-driver noise resistance, it is necessary to increase the current $I_f$ flowing through the light emitting diode.

Meanwhile, FIG. 11 shows lifespan depreciation characteristics of the photocoupler current conversion efficiency CTR, wherein the tendency is that the more the current $I_f$ increases, the shorter the time in which the current conversion efficiency CTR drops. That is, as the current conversion efficiency CTR drops in a short time when routinely increasing the phototransistor collector current, in other words, the light emitting diode current $I_f$ in order to improve noise resistance, the current drawing capability of the photocoupler after the photocoupler is turned on drops. Because of this, a long time is needed until the input signal voltage level drops below the threshold value $V_{inL}$ of FIG. 9, as a result of which, a PWM signal for driving the switching element is not accurately transmitted from the pre-driver, causing malfunction.

Consequently, it cannot be said that the method whereby the light emitting diode current $I_f$ is increased, as in the heretofore known technology according to Patent Document 1 or Patent Document 2, is optimal for preventing a drop in the current conversion efficiency CTR or preventing malfunction. Thus, there are needs in the art for an improved a photocoupler output signal receiving circuit.

SUMMARY OF THE INVENTION

Embodiments of the invention address these and other needs. Embodiments of the invention provide a photocoupler output signal receiving circuit such that, with noise resistance secured without increasing the light emitting diode current, it is possible to increase photocoupler lifespan, prevent circuit malfunction, and the like.

In some embodiments, an output signal receiving circuit that receives an output signal of a photocoupler wherein a signal output from a light emitting unit is transmitted to a light receiving unit in an isolated state, and a pull-up resistor is connected to the output side of the light receiving unit.

In some embodiments, a first constant current circuit, connected between an input terminal into which the output signal is input and the high potential side of a direct current power source, for discharging current to the light receiving unit, a second constant current circuit, connected between the input terminal and the low potential side of the direct current power source, for taking in current from the direct current power source, and switching elements that operate the first and second constant current circuits in a complementary way.

In some embodiments, the switching elements are operated so that current is taken in by the second constant current circuit after the photocoupler is turned on, and are operated so that current is discharged by the first constant current circuit after the photocoupler is turned off, and a discharge current value in a current discharge period is reduced after a certain period elapses from the start of discharging.

In some embodiments, in the output signal receiving circuit, the discharge current value after the certain period elapses is reduced to zero.

In some embodiments, in the output signal receiving circuit, the first constant current circuit includes a current mirror circuit, and the discharge current is reduced by changing the bias current of the current mirror circuit.

According to some embodiments, in a receiving circuit into which a photocoupler output signal is input, and which has a current discharge function and intake function with respect to the photocoupler, it is possible to reduce the value of current to be drawn in by the photocoupler by reducing the value of current discharged in order to pull up the voltage level of the input signal from the photocoupler after the elapse of a certain period from the current discharge point. Consequently, even with a photocoupler wherein temporal depreciation is advanced and a large current cannot be caused to flow, it is possible to reduce the input signal voltage level to the threshold value, and thus possible to increase the photocoupler lifespan and prevent circuit malfunction.

Embodiments of the invention provide an advantage of reducing circuit current consumption.

DETAILED DESCRIPTION

Figure 7:
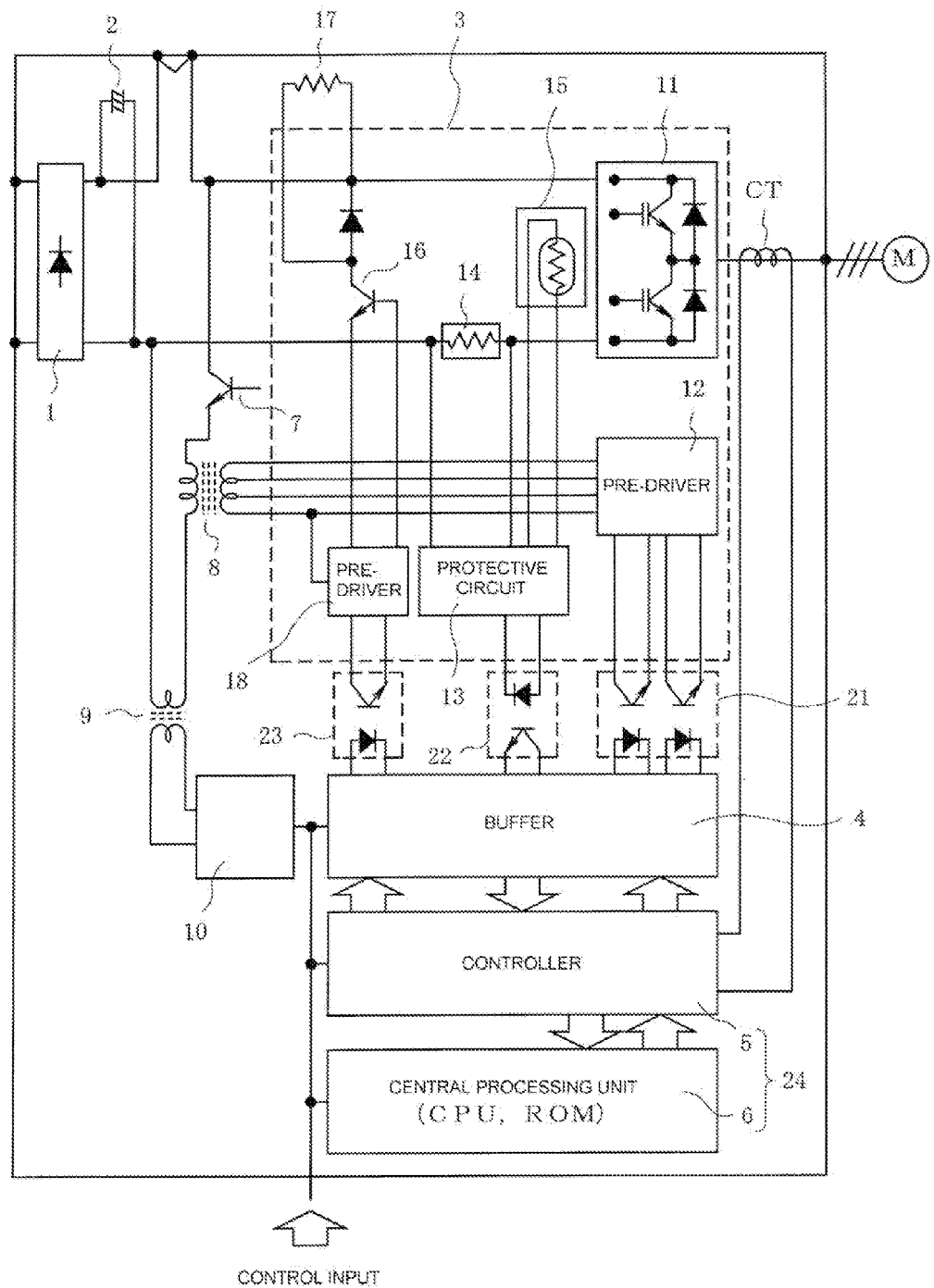
FIG. 7 is a block diagram showing an inverter device circuit configuration.

Hereafter, referring to the drawings, a description will be given of an embodiment of the invention. As an output signal receiving circuit according to the embodiment is applied to an input circuit of pre-drivers 12, 18 and the like in the previously described FIG. 7, circuit components having the same functions as those of previously described circuit components are given the same reference numerals and signs.

Figure 8:
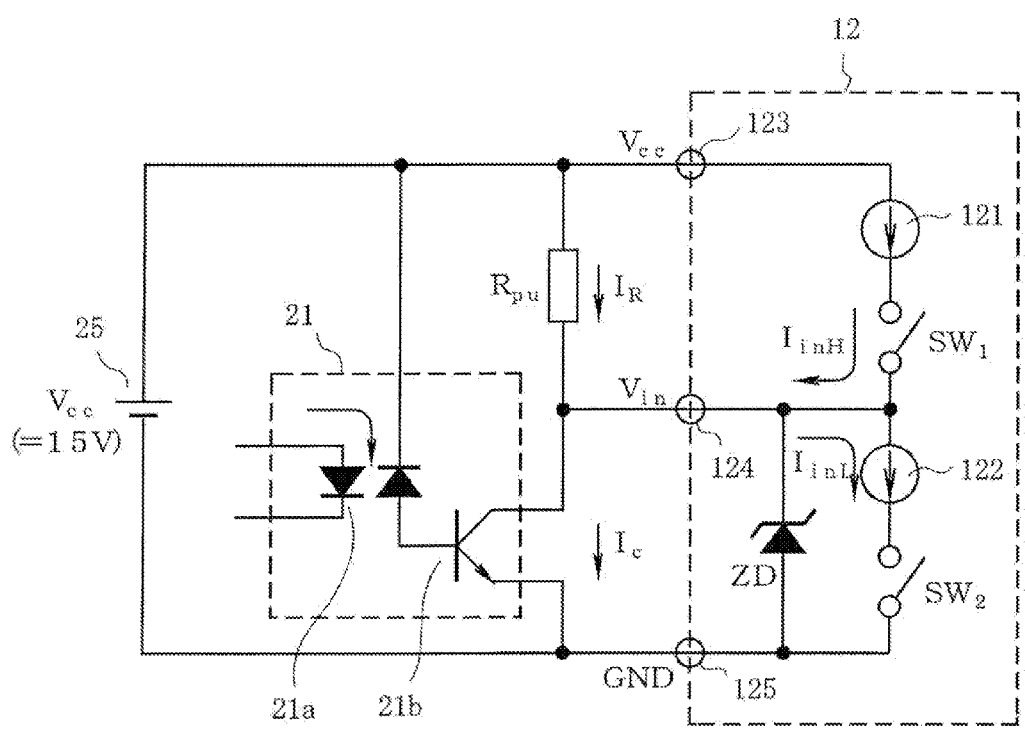
FIG. 8 is a circuit diagram of an input unit of a pre-driver in FIG. 7.
Figure 9:
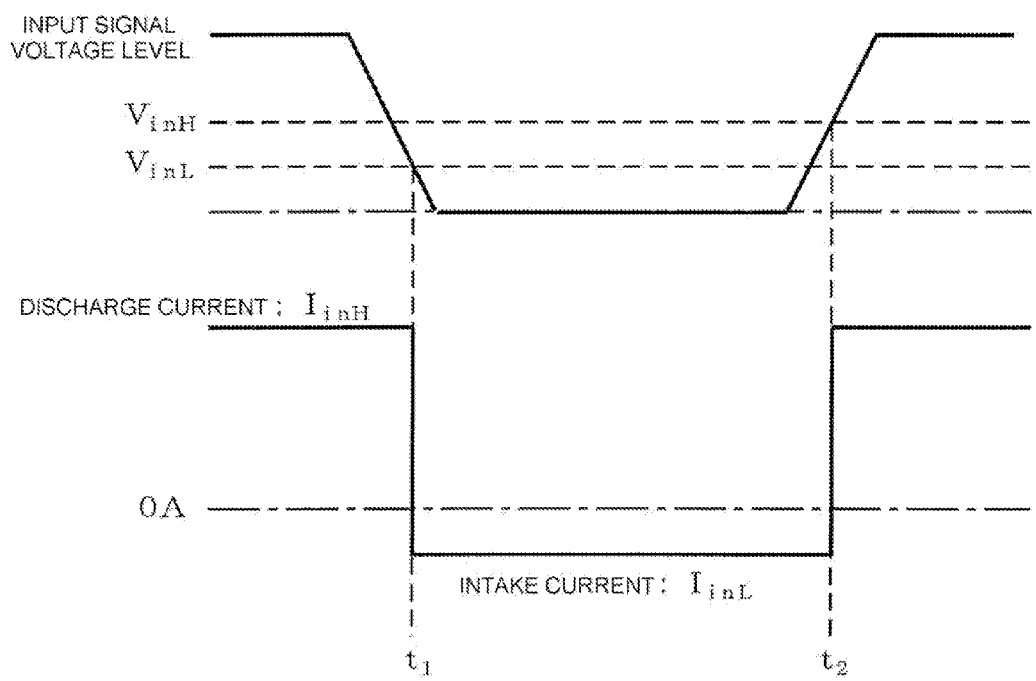
FIG. 9 is a diagram showing an input signal voltage level and a current waveform of a pre-driver in FIG. 8.
Figure 10:
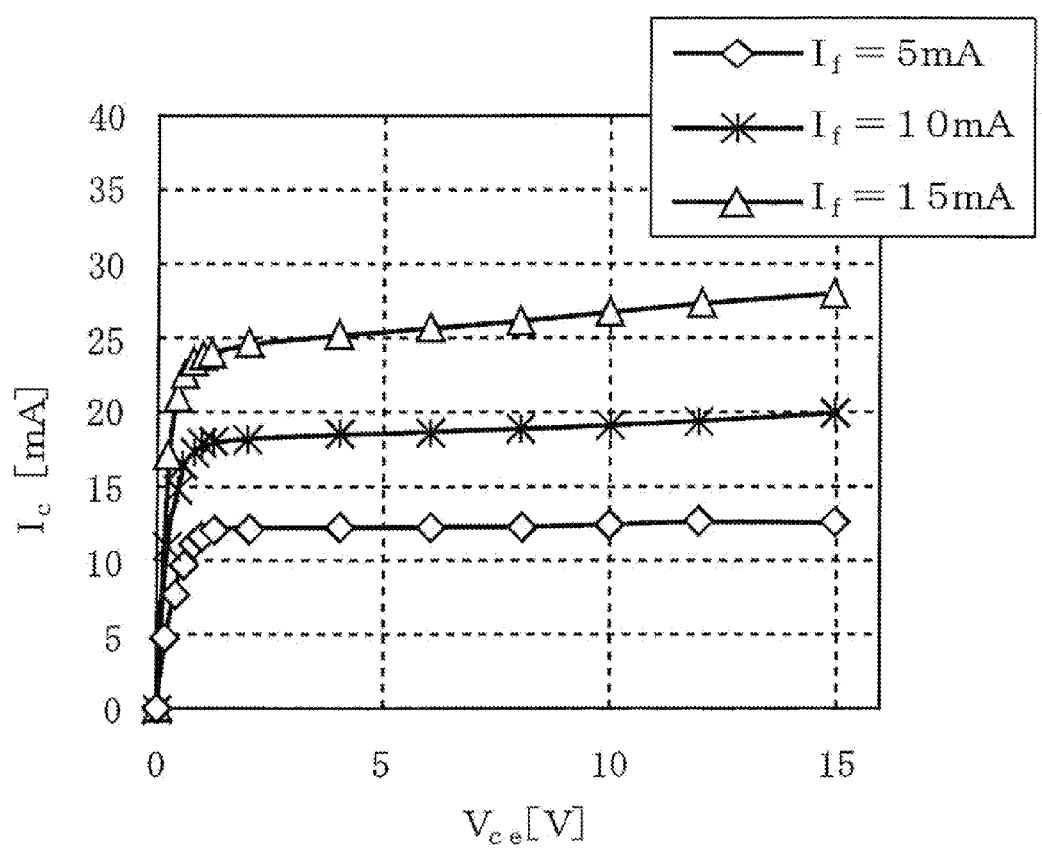
FIG. 10 shows $V_{ce}$-$I_c$ characteristics, with a current $I_f$ flowing through a photocoupler light emitting diode as a parameter.
Figure 11:
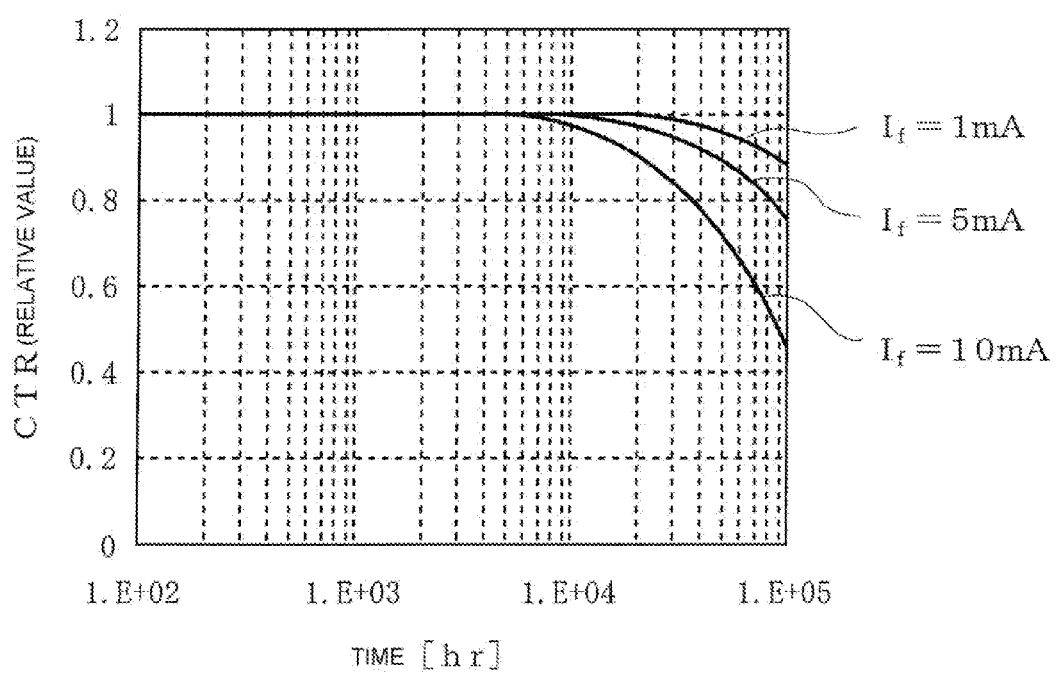
FIG. 11 is a diagram showing lifespan depreciation characteristics of a photocoupler current conversion efficiency.

First, heretofore known technology of FIG. 8 is such that, when a photocoupler 21 is off and an input signal voltage level exceeds a threshold value $V_{inH}$ at a time $t_2$ of FIG. 9, a switch $SW_1$ is turned on, a constant current circuit 121 discharges a current $I_{inH}$ to the exterior, and this condition is continued until the input signal voltage level becomes lower than a threshold value $V_{inL}$ at a time $t_1$. That is, the heretofore known technology is such that, as the large current $I_{inH}$ flows for a long time in a current discharge period, the current value to be drawn in by the photocoupler 21 the next time the photocoupler 21 is turned on, in other words, the current flowing through a light-emitting diode 21a, also increases.

Figure 3:
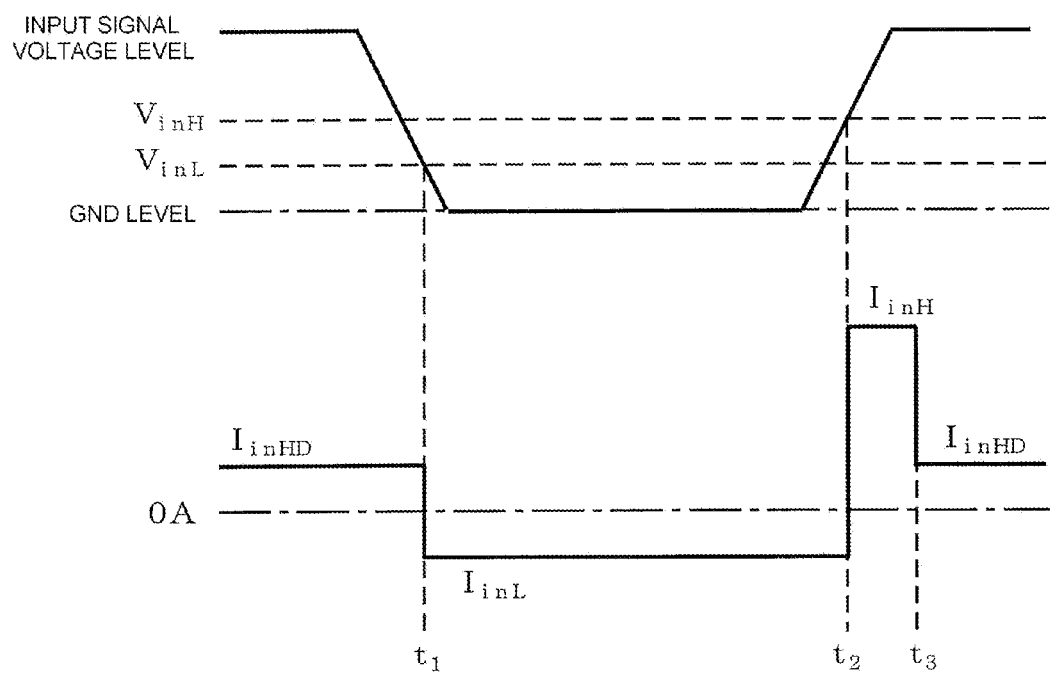
FIG. 3 is a diagram showing an input signal voltage level and a current waveform in the embodiment and an Example 1 of the invention.

As opposed to this, the embodiment of the invention is such that, by reducing the discharge current value after a certain period has elapsed from a time $t_2$, as shown in FIG. 3 to be described hereafter, the current value to be drawn in the next time the photocoupler 21 is turned on is reduced. Because of this, even in the event of the photocoupler 21 depreciating with time, a current conversion efficiency CTR decreasing, and the collector current of a phototransistor 21b decreasing, the embodiment is such that it is possible to realize a more stable operation than in a case of maintaining the discharge current at a large value, as heretofore known. Also, the embodiment is such that it is possible to prevent a circuit malfunction without increasing the current caused to flow through the light emitting diode 21a, and to increase the lifespan of the photocoupler.

At the same time, according to the embodiment, as the discharge current is reduced overall, it is also possible to reduce power consumption.

Figure 1:
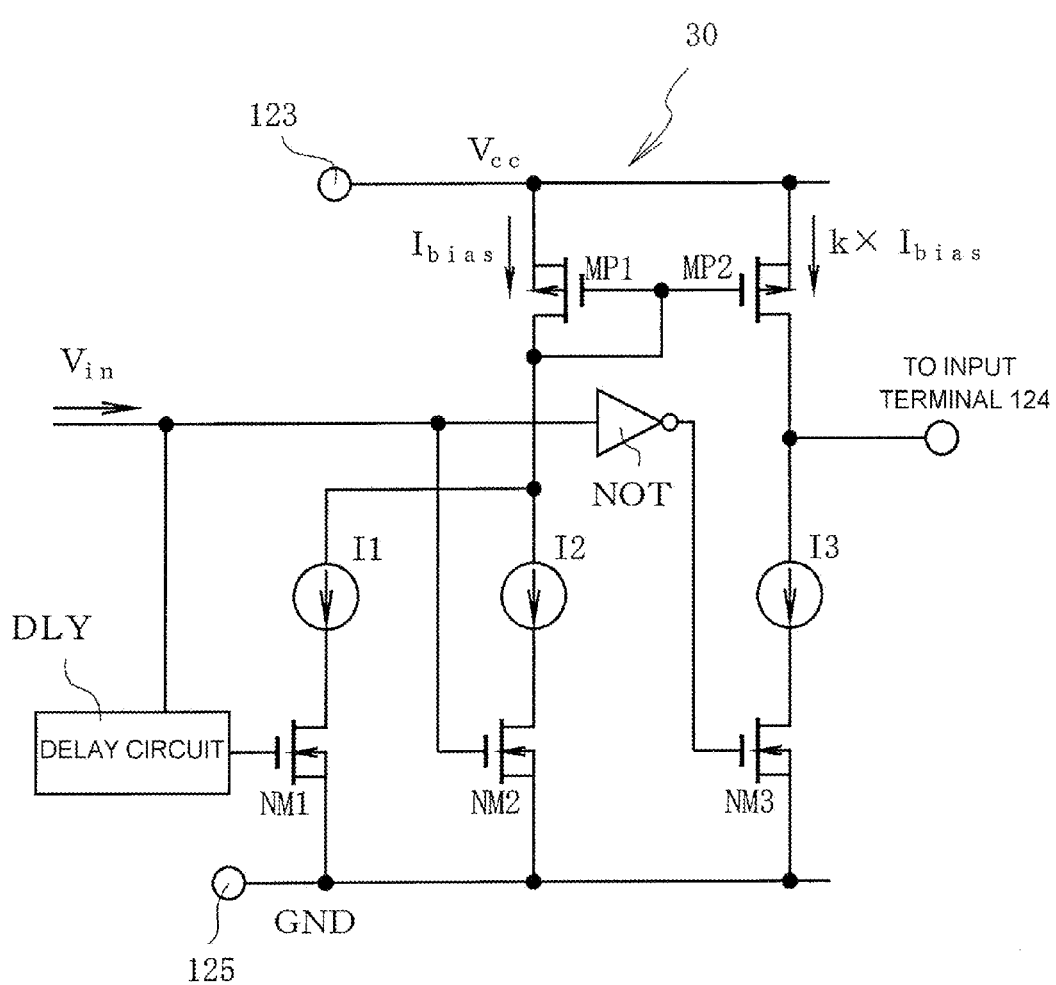
FIG. 1 is a circuit diagram of an output signal receiving circuit according to an embodiment of the invention.

FIG. 1 shows a configuration of an output signal receiving circuit 30 according to the embodiment of the invention. The output signal receiving circuit 30 configures one kind of constant current circuit driven by an input signal $V_{in}$ input into a pre-driver from the phototransistor 21b of the photocoupler 21. The constant current circuit has a current discharge function and a current intake function with respect to the photocoupler 21.

In FIG. 1, a power source terminal 123 to which a power source voltage $V_{cc}$ is applied is connected via the source and drain of a first switching element MP1 to first and second current sources I1 and I2, and the output sides of the current sources I1 and I2 are connected via the drain and source of third and fourth switching elements NM1 and NM2 to a ground terminal 125. Also, the power source terminal 123 is connected via the source and drain of a second switching element MP2 to a pre-driver input terminal 124 and a third current source I3, and the output side of the current source I3 is connected via the drain and source of a fifth switching element NM3 to the ground terminal 125. Furthermore, the gates of the first and second switching elements MP1 and MP2 are collectively connected to a contact point of the first and second current sources I1 and I2.

Herein, the first and second switching elements MP1 and MP2 are, for example, p-channel enhancement type MOSFETs (Metal Oxide Semiconductor Field Effect Transistors), and the switching elements MP1 and MP2 configure a current mirror circuit. Also, the third, fourth, and fifth switching elements NM1, NM2, and NM3 are configured of n-channel enhancement type MOSFETs.

The input signal $V_{in}$ to the pre-driver is applied via a delay circuit DLY to the gate of the third switching element NM1, and is applied directly to the gate of the fourth switching element NM2. Also, the input signal $V_{in}$ is also applied via a NOT circuit NOT to the gate of the fifth switching element NM3.

In the heretofore described configuration, the switching elements MP1 and MP2 and power sources I1 and I2 correspond to a first constant current circuit in claim 1, and in the same way, the current source I3 corresponds to a second constant current circuit. Also, the first and second constant current circuits also correspond to the constant current circuits 121 (discharge side) and 122 (intake side) respectively in FIG. 8.

Furthermore, the switching elements NM1 to NM3 correspond to switching elements that operate the first and second constant current circuits in a complementary way.

Figure 2:
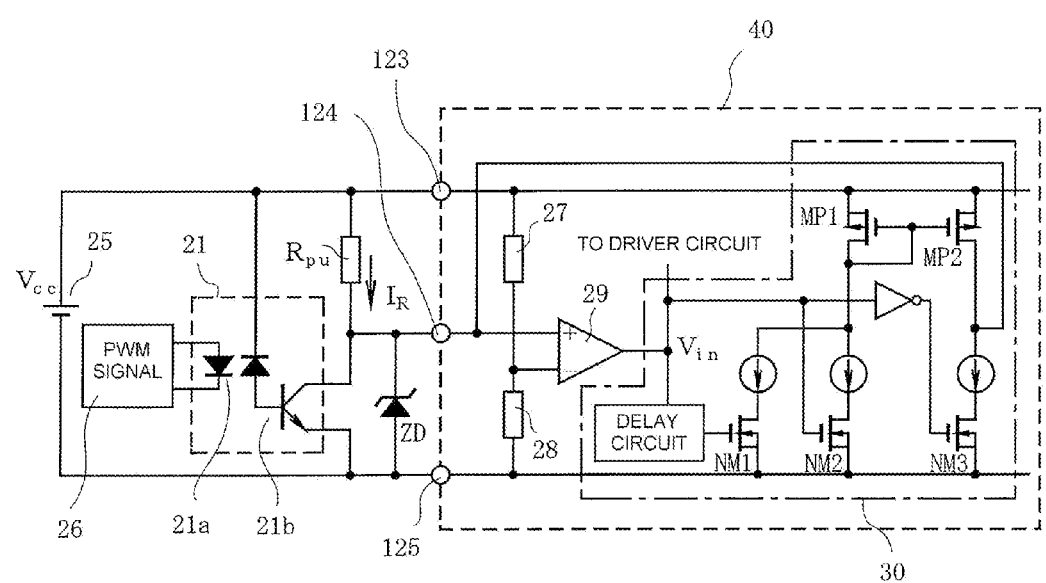
FIG. 2 is a circuit diagram of a condition wherein the circuit of FIG. 1 is installed in a pre-driver.

Next, FIG. 2 is a circuit diagram showing a condition wherein the output signal receiving circuit 30 of FIG. 1 is installed in a pre-driver 40. Although the pre-driver 40 includes circuits that generate a drive signal (gate signal) of an inverter 11 in FIG. 7, a depiction of these circuits is omitted from FIG. 2.

In FIG. 2, 26 is a PWM signal generator circuit connected to the light emitting diode 21a, which acts as a light emitting unit of the photocoupler 21, $R_{pu}$ is a pull-up resistor connected between a collector of the phototransistor 21b, which acts as a light receiving unit of the photocoupler 21, and the positive electrode of a direct current power source 25, and ZD is a Zener diode, in the same way as in FIG. 8.

Also, on the input side of the pre-driver 40, 27 and 28 are resistors that divide the power source voltage $V_{cc}$, and the voltage dividing point thereof is input into an inverting input terminal of a comparator 29. Furthermore, the output of the collector of the phototransistor 21b is input into the non-inverting input terminal of the comparator 29, and the output thereof is sent to the output signal receiving circuit 30 as the input signal $V_{in}$.

Next, an operation of the embodiment will be described, while referring to FIG. 3. FIG. 3 shows the voltage level of the input signal $V_{in}$ and a current waveform.

When the photocoupler 21 of FIG. 2 switches from on to off, the voltage level of the input signal $V_{in}$ rises, and as the input signal voltage level is pulled up by the pull-up resistor $R_{pu}$ when the voltage level exceeds a threshold value $V_{inH}$ at a time $t_2$ of FIG. 3, the operation of the output signal receiving circuit 30 switches from a current intake to a current discharge. In the circuits of FIG. 1 and FIG. 2, the switching element NM3 to whose gate the input signal $V_{in}$ is applied via the NOT circuit NOT switches from on to off, and conversely, the switching elements NM1 and NM2 switch from off to on.

As the input signal $V_{in}$ is input via the delay circuit DLY into the gate of the switching element NM1, the switching element NM1 is turned off at a time $t_3$ at which a certain period (a delay circuit DLY delay time) has elapsed from the time $t_2$.

Herein, as the switching elements MP1 and MP2 configure a current mirror circuit, a current ($k \times I_{bias}$) of a size k (k is a proportional invariable) proportional to a current $I_{bias}$ flowing through the switching element MP1 flows through the switching element MP2 when current is discharged, and the current is discharged to the input terminal 124 as a discharge current $I_{inH}$.

As the embodiment is such that, immediately after the input signal voltage level exceeds the threshold value $V_{inH}$ at the time $t_2$ of FIG. 3 and the operation switches to a current discharge, the operation is such as to discharge a greater current in order to pull the input signal voltage level up more quickly, the switching elements NM1 and NM2 are turned on, and a current that is the sum of the current sources I1 and I2 is caused to flow as $I_{bias}$ through the switching element MP1. By causing a greater current to flow through the switching element MP1 in this way, a current flowing through the other switching element MP2, that is, the discharge current $I_{inH}$, also increases.

Subsequently, by the input signal voltage level being sufficiently pulled up, and by the switching element NM1 being turned off by an operation of the delay circuit DLY at the time $t_3$ within a time shorter than one half of a PWM signal cycle, the current flowing through the switching element MP1 is reduced, and the discharge current of the switching element MP2 is reduced as far as $I_{inHD}$ of FIG. 3.

When the photocoupler 21 switches from off to on, the voltage level of the input signal from the photocoupler 21 drops, and when the voltage level drops below a threshold value $V_{inL}$ at a time $t_1$ of FIG. 3, the operation of the output signal receiving circuit 30 switches from a current discharge to a current intake. In the circuits of FIG. 1 and FIG. 2, the switching element NM1 to whose gate the input signal $V_{in}$ is applied via the delay circuit DLY, and the switching element NM2 to whose gate the input signal $V_{in}$ is applied directly, switch from on to off, and the switching element NM3 to whose gate the input signal $V_{in}$ is applied via the NOT circuit NOT switches from off to on.

As the switching elements NM1 and NM2 are off at this time, no current flows through the switching elements MP1 and MP2, and meanwhile, as the switching element NM3 is on, an intake current $I_{inL}$ flows from the input terminal 124 to the switching element NM3 side for a period of the times $t_1$ to $t_2$ of FIG. 3.

Herein, immediately after the photocoupler 21 switches from off to on, the input signal voltage level must be lowered by the phototransistor 21b of the photocoupler 21 drawing in the discharge current $I_{inHD}$ for pulling up the input signal voltage level and a current $I_R$ flowing through the pull-up resistor $R_{pu}$. In this case, provided that the photocoupler is a sound one that has not suffered temporal depreciation, it is possible to cause the flow of a current sufficient to lower the input signal voltage level, but the value of current that can be caused to flow decreases with the advance of temporal depreciation, and the time needed to lower the input signal voltage level increases. Then, it eventually becomes impossible to lower the input signal voltage level as far as $V_{inL}$ within the PWM signal cycle, which reduces the lifespan of the photocoupler.

However, the embodiment is such that, as the value of current discharged in order to pull up the voltage level is reduced from $I_{inH}$ to $I_{inHD}$, as previously described, the value of current to be drawn in by the photocoupler 21 decreases. Consequently, even with a photocoupler in which temporal depreciation is advanced, it is possible to lower the input signal voltage level, as a result of which, it is possible to increase the lifespan of the photocoupler 21.

EXAMPLE 1

Figure 4:
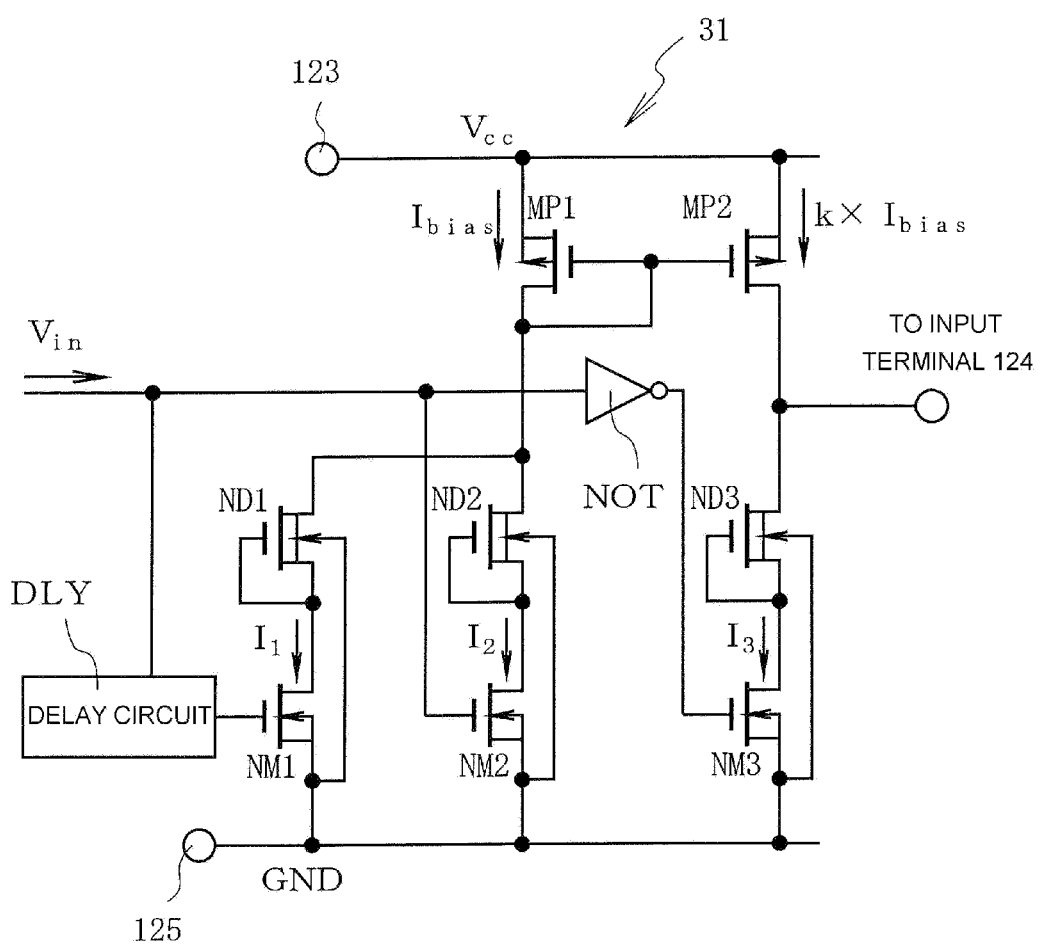
FIG. 4 is a circuit diagram of an output signal receiving circuit according to the Example 1 of the invention.

Next, FIG. 4 is a circuit diagram showing an output signal receiving circuit 31 according to an Example 1 of the invention.

The example is such that n-channel depression type MOSFETs ND1 to ND3 are used as the current sources I1 to I3 of FIG. 1. The input signal voltage level and current waveform in the example are the same as those of FIG. 3.

In the Example 1, $V_{cc}$=15(V), the pull-up resistor $R_{pu}$=90 (kΩ), the discharge current $I_{inH}$=1 (mA), the discharge current $I_{inHD}$ after the below-mentioned delay time has elapsed=200 (μA), the intake current $I_{inL}$=50 (μA), $V_{inL}$=1.5 (V), $V_{inH}$=2 (V), and the delay circuit DLY delay time=3 (μsec).

As is clear from the embodiment of FIG. 1 to FIG. 3, when the photocoupler 21 switches from on to off, the circuit operation switches from a current intake to a current discharge, and 1 (mA) is discharged as $I_{inH}$. At this time, the switching element NM3 switches from on to off, and the switching elements NM1 and NM2 switch from off to on. Subsequently, the switching element NM1 is turned off 3 (μsec) later by an operation of the delay circuit DLY. 3 (μsec) is a sufficiently short time when compared to the cycle of the PWM signal used in an IPM.

Herein, the gate channel lengths of the switching elements MP1 and MP2 configuring a current mirror circuit are the same, and the MP1 to MP2 gate channel width ratio is 1 to 5. In this case, when current is discharged, a current five times the current $I_{bias}$ (=200 (μA)) flowing through the switching element MP1, that is 1 (mA), flows through the switching element MP2, and this current is discharged as the discharge current $I_{inH}$ to the input terminal 124.

Immediately after the input signal voltage level exceeds the threshold value $V_{inH}$, and the operation switches to a current discharge, the switching elements NM1 and NM2 are turned on. Because of this, a current (=200 (μA)) wherein a current $I_1$ (=160 (μA)) flowing through the switching element NM1 and a current $I_2$ (=40 (μA)) flowing through the switching element NM2 are added together flows through the switching element MP1 as $I_{bias}$. 3 (μsec) after this, by turning off the switching element NM1 using an operation of the delay circuit DLY, the current $I_{bias}$ flowing through the switching element MP1 becomes only the 40 (μA) of the switching element NM2. Consequently, the current flowing through the switching element MP2 becomes $I_{inHD}$=40 (μA)×5=200 (μA) in accordance with the current mirror circuit ratio, and the discharged current decreases to one-fifth.

When the photocoupler 21 switches from off to on, the input signal voltage level drops, and when the voltage level drops below the threshold value $V_{inL}$, the circuit operation switches from a discharge to an intake. In FIG. 4, the switching element NM2 switches from on to off, and the switching element NM3 switches from off to on. As the switching elements NM1 and NM2 are off at this time, no current flows through the switching elements MP1 and MP2, and as the switching element NM3 is on, an intake current $I_{inL}$=50 (μA) flows from the input terminal 124 to the switching element NM3 side.

Herein, immediately after the photocoupler 21 switches from off to on, the input signal voltage level must be lowered by the photocoupler 21 drawing in the total value of the current $I_{inHD}$=200 (μA) discharged in order to pull up the input signal voltage level and the current $I_R$=750 (μA) flowing through the pull-up resistor $R_{pu}$. An initial condition photocoupler that has not suffered temporal depreciation has a PWM signal circuit designed so that a current in the region of 3 (mA) flows, and in an initial condition, it is possible to cause the flow of a current sufficient to lower the input signal voltage level. However, when temporal depreciation advances, and CTR is, for example, 50%, the current that can be drawn in by the photocoupler is in the region of 1.5 (mA).

An operation of FIG. 9 described as heretofore known technology is such that the current that must be drawn in by the photocoupler 21 is a current of 1.75 (mA) wherein $I_{inH}$=1 (mA) and $I_R$=750 (μA) are added together, and it is not possible to draw in sufficient current at 1.5 (mA), which is the limit that can be caused to flow in a photocoupler that has depreciated to a CTR of 50%. Because of this, it is not possible to reduce the input signal voltage level to the threshold value $V_{inL}$, the PWM signal is not accurately transmitted by the pre-driver, and a malfunction occurs. As opposed to this, according to the circuit of the Example 1, the current that must be drawn in by the photocoupler 21 immediately after the photocoupler 21 switches from off to on is 950 (μA), which is the value of $I_{inHD}$=200 (μA) and $I_R$=750 (μA) added together. Therefore, response is quite sufficient even when the current that can be caused to flow in a photocoupler that has depreciated to a CTR of 50% is 1.5 (mA), and it is possible to reduce the input signal voltage level, and thus use the photocoupler for an increased lifespan.

Also, the example also has the advantage of reducing current consumption.

That is, in FIG. 4, $I_{bias}$=200 (μA) flows as a current mirror circuit bias current for a period for which the output signal receiving circuit 31 discharges current. However, as the discharge current decreases to one-fifth 3 (μsec) after the circuit operation switches to the current discharge side, the bias current $I_{bias}$ for causing the discharge current to flow also becomes one-fifth, after which it is possible to reduce the bias current consumed in a period until the operation switches to the current intake side.

EXAMPLE 2

Figure 5:
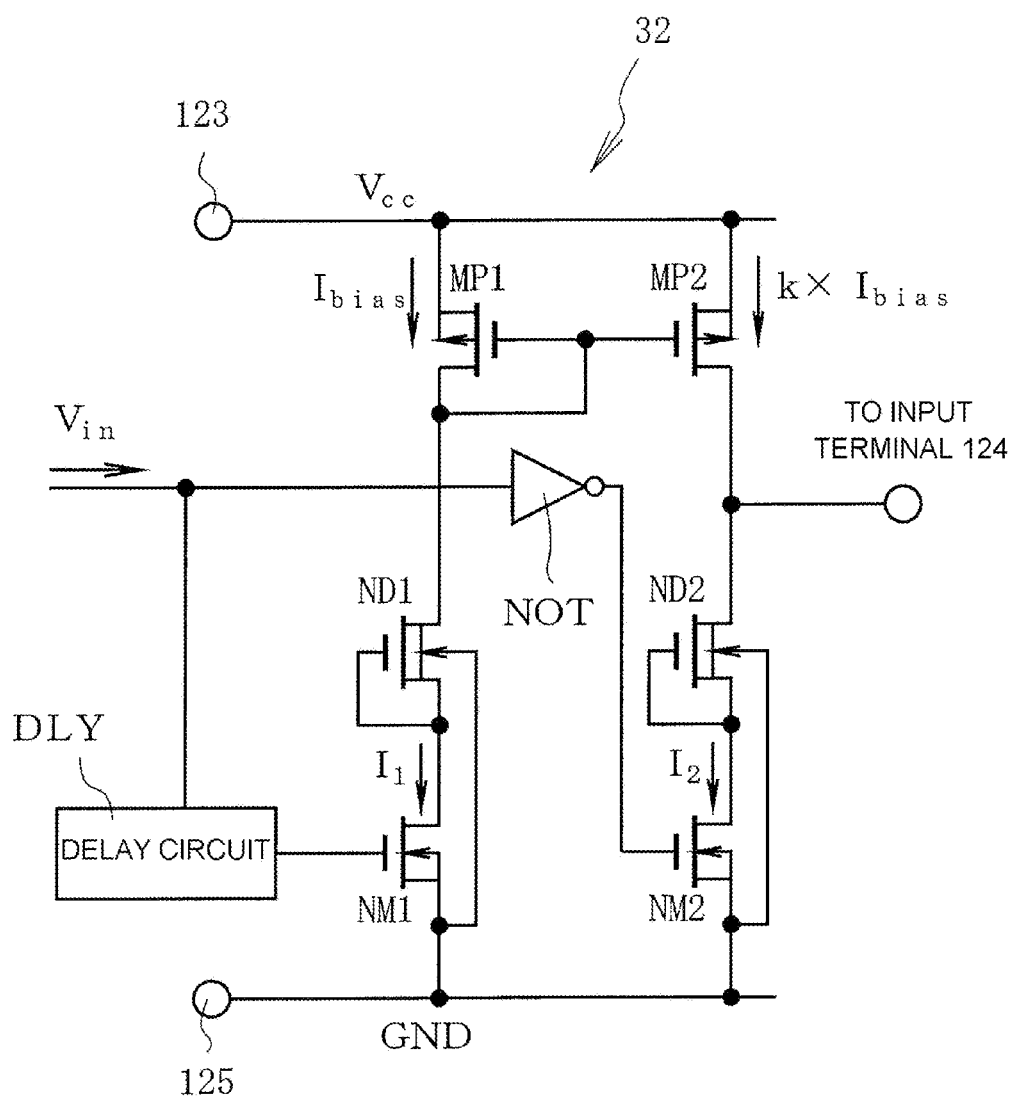
FIG. 5 is a circuit diagram of an output signal receiving circuit according to an Example 2 of the invention.

FIG. 5 is a circuit diagram showing an output signal receiving circuit 32 according to an Example 2 of the invention. The example is such that the switching elements ND2 and NM2 in the Example 1 of FIG. 4 are eliminated. The Example 2 of FIG. 5 is such that the reference numerals and signs of the switching elements ND3 and NM3 in FIG. 4 are changed to ND2 and NM2 respectively, but the functions of the switching elements ND3 and NM3 in FIG. 4 are the same as the functions of the switching elements ND2 and NM2 respectively in FIG. 5.

Figure 6:
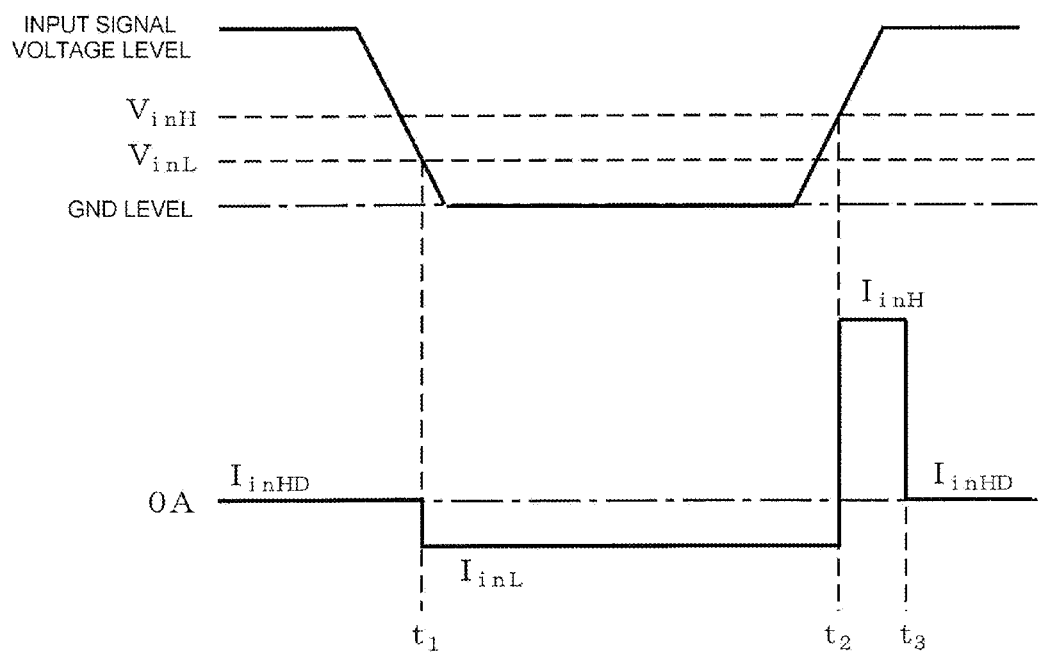
FIG. 6 is a diagram showing an input signal voltage level and a current waveform in the Example 2 of the invention.

FIG. 6 is a diagram showing the input signal voltage level and current waveform of the Example 2.

In the Example 2, $V_{cc}$=15(V), the pull-up resistor $R_{pu}$=20 (kΩ), the discharge current $I_{inH}$=1 (mA), the discharge current $I_{inHD}$ after the below-mentioned delay time has elapsed=0 (A), the intake current $I_{inL}$=50 (μA), $V_{inL}$=1.5 (V), $V_{inH}$=2 (V), and the delay circuit DLY delay time=5 (μsec).

When the photocoupler 21 switches from on to off, the circuit operation switches from a current intake to a current discharge, and 1 (mA) is discharged as $I_{inH}$ at a time $t_2$ of FIG. 6. At this time, the switching element NM2 switches from on to off, and the switching element NM1 switches from off to on. Subsequently, the switching element NM1 is turned off of a time $t_3$ which is 5 (μsec) after the time $t_2$ by an operation of the delay circuit DLY. 5 (μsec) is a sufficiently short time when compared to the cycle of the PWM signal used in an IPM.

The characteristics of the switching elements MP1 and MP2 configuring a current mirror circuit being the same as in the Example 1, a current of 1 (mA), five times the current $I_{bias}$ (=200 (μA)) flowing through the switching element MP1, flows through the switching element MP2, and is discharged as the current $I_{inH}$ to the input terminal 124.

Immediately after the input signal voltage level exceeds the threshold value $V_{inH}$, and the operation switches to a current discharge, a current (=200 (μA)) flows via the switching element ND1 through the switching element MP1 as $I_{bias}$ by the switching element NM1 being turned on. When 5 (μsec) have elapsed after this, at a time $t_3$ of FIG. 6, the current $I_{bias}$ flowing through the switching element MP1 becomes zero by turning off the switching element NM1 using an operation of the delay circuit DLY. Because of this, no current flows through the switching element MP2 either, and the discharge current $I_{inH}$ also becomes zero ($I_{inHD}$=0), as shown in FIG. 6.

When the photocoupler 21 switches from off to on, the input signal voltage level drops, and when the voltage level drops below the threshold value $V_{inL}$, at a time $t_1$ of FIG. 6, the circuit operation switches from a discharge to an intake, and the switching element NM2 switches from on to off. As the switching element NM1 is off at this time, no current flows through the switching elements MP1 and MP2, and as the switching element NM2 is on, an intake current $I_{inL}$=50 (μA) flows from the input terminal 124 to the switching element NM2 side.

Herein, immediately after the photocoupler 21 switches from off to on, the input signal voltage level must be lowered by the photocoupler 21 drawing in the current $I_R$=750 (μA) flowing through the pull-up resistor $R_{pu}$ in order to pull up the input signal voltage level.

In the same way as previously described, in a condition in which the design is such that a current in the region of 3 (mA) flows through a photocoupler in an initial condition, the upper limit value of the current that can be drawn in by the photocoupler is 900 (μA) when temporal depreciation advances and CTR is, for example, 30%.

In this case, as the example is such that the current that must be drawn in by the photocoupler 21 is only the previously mentioned $I_R$=750 (μA), it is possible to draw in a sufficient current, thereby reducing the input signal voltage level, even when the photocoupler has depreciated to a CTR of 30%, and it is thus possible to use the photocoupler for an increased lifespan.

However, as the Example 2 is such that a malfunction due to the effect of external noise is likely to occur because of reducing the discharge current to zero, it is necessary to use the photocoupler in a circuit wherein external noise is sufficiently suppressed.

Also, although the example is such that 200 (μA) flows as the bias current $I_{bias}$ when current is discharged, the discharge current $I_{inH}$ becomes zero 5 (μsec) after the operation switches to the current discharge side. Consequently, the bias current $I_{bias}$ for causing the discharge current to flow also becomes zero, after which it is possible to reduce the bias current consumed in a period until the operation switches to the current intake side, in the same way as in the Example 1.

Embodiments of the invention can be utilized for increasing photocoupler lifespan and preventing malfunction not only in a pre-driver input circuit in an IPM, but in any kind of signal processing circuit that processes a signal isolated and transmitted by a photocoupler.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

What is claimed is:

1. A photocoupler output signal receiving circuit that receives an output signal of a photocoupler wherein a signal output from a light emitting unit is transmitted to a light receiving unit in an isolated state, and a pull-up resistor is connected to an output side of the light receiving unit, the photocoupler output signal receiving circuit comprising:

a first constant current circuit, connected between an input terminal into which the output signal is input and a high potential side of a direct current power source, that discharges current to the light receiving unit;

a second constant current circuit, connected between the input terminal and a low potential side of the direct current power source, that takes in current from the direct current power source; and switching elements that operate the first and second constant current circuits in a complementary way, wherein the switching elements are operated so that current is taken in by the second constant current circuit after the photocoupler is turned on, and are operated so that current is discharged by the first constant current circuit after the photocoupler is turned off, and a discharge current value in a current discharge period is reduced after a certain period elapses from a start of discharge of the current of the first constant current circuit after the photocoupler is turned off, wherein the first constant current circuit includes a current mirror circuit, and the discharge current value is reduced by changing a bias current of the current mirror circuit.

2. The photocoupler output signal receiving circuit according to claim 1, wherein the discharge current value after the certain period elapses is reduced to zero.

\* \* \* \* \*